United States Patent [19]

Knuth et al.

[11] 4,250,615
[45] Feb. 17, 1981

[54] APPARATUS FOR MOUNTING ELECTRONIC COMPONENTS ON A PRINTED CIRCUIT BOARD

[75] Inventors: Kenneth V. Knuth, Malvern; Charles E. Walton, II, Downingtown, both of Pa.

[73] Assignee: Burroughs Corporation, Detroit, Mich.

[21] Appl. No.: 49,091

[22] Filed: Jun. 18, 1979

[51] Int. Cl.³ .............................................. H05K 3/30
[52] U.S. Cl. ...................................... 29/741; 29/759; 29/809; 29/834; 221/93
[58] Field of Search ................. 29/739, 741, 759, 760, 29/833–841; 269/321 WE; 221/93

[56] References Cited

U.S. PATENT DOCUMENTS

| | | | |
|---|---|---|---|
| 3,710,479 | 1/1973 | Bernardo | 29/741 |
| 4,149,311 | 4/1979 | Benson et al. | 29/741 |

Primary Examiner—Carl E. Hall
Attorney, Agent, or Firm—Mark T. Starr

[57] ABSTRACT

An apparatus for dispensing groups of integrated circuit (IC) packages in a pattern and quantity corresponding to the pattern of unpopulated IC sockets on a printed circuit board. The apparatus includes a plurality of storage racks stacked one on top of another, with each rack corresponding to one row of socket positions on the unpopulated printed circuit board. Each storage rack includes a number of loaded IC dispenser magazines corresponding to the number of positions in that rack's corresponding row of socket positions which are to be populated with IC packages. The storage racks are normally supported at an acute angle which is less than that at which IC packages will slide down the dispenser magazines. The bottom storage rack includes a handle and it is pivotable at its lower end. When the assembler-operator pulls up on the handle, the storage racks are pivoted to an angle at which one component is dispensed from each dispenser magazine. The operator then restores the storage racks to their normal position, thus providing him with a set of IC packages dispensed in a pattern corresponding to the pattern of unpopulated IC sockets on the printed circuit board.

14 Claims, 2 Drawing Figures

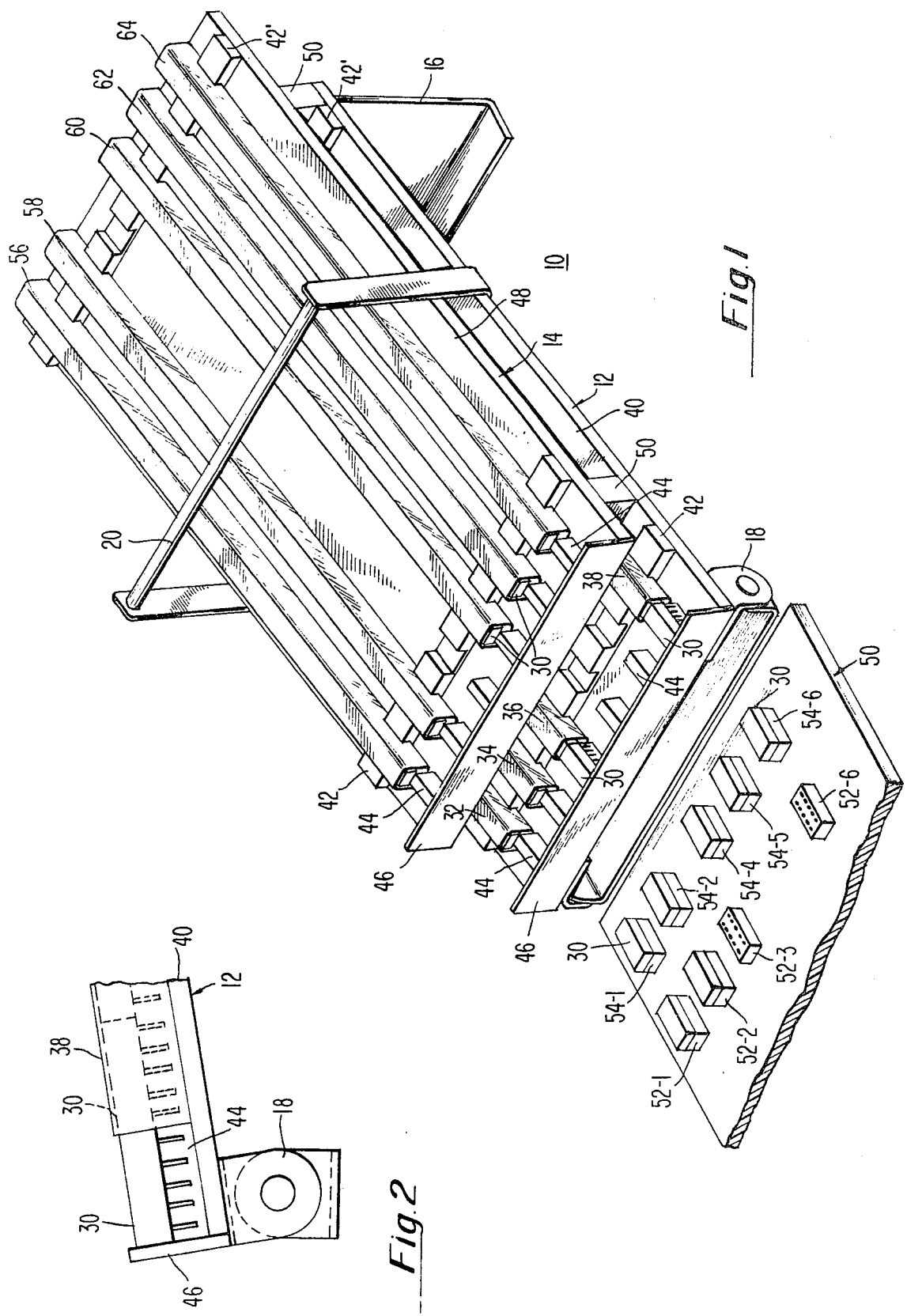

APPARATUS FOR MOUNTING ELECTRONIC COMPONENTS ON A PRINTED CIRCUIT BOARD

BACKGROUND OF THE INVENTION

This invention relates in general to an apparatus for dispensing electronic components and indicating to an assembler installation locations of the dispensed components on a workpiece. In particular, the apparatus finds use in dispensing a set of one or more types of integrated circuit packages in a pattern corresponding to positions on a printed circuit which are to be populated with the dispensed set of integrated circuit packages.

Assembling discrete electronic parts on a circuit board by hand is a tedious, time-consuming and costly procedure which requires concentrated effort on the part of an assembler. This problem has become more acute in recent years due to the proliferation of miniturized components such as integrated circuit packages and the like. The miniturized parts are difficult to handle and are somewhat delicate due to their small size and the multiple leads extending from the package. The assembly problem is aggravated by the increase in the number of parts which must be assembled in a given area. This increase is made possible by the miniturized parts themselves and by the development of more sophisticated techniques for manufacturing the printed circuit boards.

Program controlled systems have been developed to alleviate the assembly problem and reduce costs. One type of prior art system is a fully automatic system, such as that disclosed in U.S. Pat. No. 3,591,911, issued to Sandor Goldschmied on July 31, 1971, which dispenses and inserts the parts in the circuit board. Another type of system is a semiautomatic system which dispenses parts and indicates to an assembler where the parts are to be installed.

Due to the initial cost of the machine and the setup time required for each different type of printed circuit board, the fully automatic system is only feasible in manufacturing installations where large numbers of a specific circuit board are to be assembled. Therefore, the semiautomatic system would seem more practical for assembling limited quantities of a variety of circuit board types.

One particular prior art semiautomatic system is a numerically controlled apparatus which is capable of handling any type of component. This system selects parts trays from a tray storage area and moves the trays in a predetermined sequence to within reach of the assembler. This prior art system includes an overhead projector which gives visual indications to the assembler of positioning of the parts. The visual indications are displayed in a program controlled sequence which is in synchronism with the movements of the parts trays. This prior art system is undesirable from an initial cost and maintenance standpoint due to the complex mechanisms required to randomly access the parts trays and transport them to the assembler. Another undesirable feature of this system is that the individual components must be removed from their shipping containers and loaded into the trays. This step subjects the parts to possible lead entanglement and damage. The random loading of the parts into trays also requires that, when applicable, the assembler orient each part according to the polarity indicated by the projector.

Other semiautomatic systems, similar to the latter, suffer from the same drawbacks. Typical of such systems is that disclosed in U.S. Pat. No. 3,383,011, issued to Herbert M. Reed et al., on May 14, 1968. Although these types of semiautomatic systems may handle some types of component parts quite efficiently, it may also be apparent that some types of component parts need special handling.

One particular component part which may be more efficiently and safely handled by a specialized apparatus is the dual-in-line integrated circuit package (DIP). The DIP is used in large quantities. However, due to its physical configuration, the DIP is particularly troublesome to the assembler. The DIP is provided with an incapsulated circuit body with two parallel rows of leads extending from opposite sides of the body, each row usually having seven or more leads. The DIP may be mounted directly on a printed circuit board by inserting the leads into a cluster of holes formed in the board and then soldering the leads in place. Alternately, the DIP may be mounted on a socket which is already mounted on a printed circuit board, the socket providing a cluster of holes to receive the DIP leads. Caution must be exercised in handling the DIPs as misalignment of one or more of the leads will make installation of the part difficult, if not impossible. The DIP is also troublesome in that all types look alike and all must be properly oriented to maintain polarity.

To prevent damage to the delicate leads of the DIP, they are usually shipped from the manufacturer in an elongated tubular magazine. The DIPs within the magazines are all oriented in the same direction, thus maintaining proper polarity orientation. In the particular prior art devices hereinbefore described, the DIPs must be unloaded from the magazines and deposited in the parts trays. This requires an extra time-consuming handling operation, results in loss of parts polarity orientation and could possibly result in damage to the parts.

Apparatuses utilizing tubular magazines to insert DIPs in circuit boards are known in the prior art. Thus in a pending U.S. patent application No. 963,116, filed by John Halmer Drinkard, Jr. on Nov. 22, 1978, and assigned to the same assignee as the present application, an apparatus for use in installing DIP-type sockets on printed circuit boards is disclosed. In this apparatus, a frame, on which is mounted tubular magazines loaded with sockets, is positioned at an acute angle and vibrated at low frequency, causing the sockets to slide down the magazines. A template, containing cavities to receive the sockets, is slidably mouned at the lower end of the magazines. As the sockets are discharged from the magazines, they fall into the cavities, lead side up. A printed circuit board is aligned above the loaded template and the two are clamped together causing the socket pins to pass through corresponding holes in the printed circuit board. The clamped printed circuit board and template are then rotated 180 degrees and the template is removed, leaving the sockets mounted on the printed circuit board. Although the latter described apparatus does have the advantages of not requiring the assembler to insert each socket on the board, of being particularly well suited to circuit boards to be populated with a large number of sockets, and of being relatively low in cost, the apparatus requires a relatively large amount of time to complete the insertion operation, particularly when used with printed circuit boards which require a relatively small number of sockets to be inserted. In addition, the latter apparatus cannot insert different types of sockets in sequential positions in a single printed circuit board column, although it can insert different types in different rows.

Another semiautomatic system which utilizes magazines to dispense DIPs is that disclosed in U.S. Pat. No. 3,760,484, issued Sept. 25, 1973, to John L. Kowalski. The Kowalski assembly system comprises a program controlling means (i.e., a paper tape transport) for supplying a parts identification signal to a magazine storage station and an installation signal to an electrically operable visual indicating means at an assembly station. The magazine storage station selectively releases one part from one of the plurality of magazines of the magazine storage station by means of escapement mechanisms. The visual indicating means indicates the correct positioning of the released part to an assembler for placement into an assembly jig at the assembly station. Although the Kowalski system provides for the protection of parts, it too is undesirable from an initial cost and maintenance standpoint, due to the escapement mechanisms and electronics required to release each part. Another undesirable feature of this system is that it must be programmed each time the location or type of DIP to be installed on a printed circuit board is changed.

In view of the foregoing, the need exists for a new and useful low cost semiautomatic assembly system that is specifically adapted to handle electronic components which are shipped in magazine-like containers.

SUMMARY OF THE INVENTION

In accordance with the present invention, a new and useful semiautomatic manual component assembly apparatus is disclosed.

The assembly apparatus includes a plurality of magazine storage stations which are positioned one on top of another. Each magazine storage station provides storage for the components to be installed in one row of the positions on the printed circuit board which are to be populated with components. Each storage station includes a number of magazines equal to the number of positions (or columns) in that magazine's respective printed circuit board row. Thus, each magazine is used to store the type of component which is to be inserted in the printed circuit board's position corresponding to the magazine's column and the respective storage station's row.

The stacked storage stations are normally positioned at an acute angle which is less than that at which components will slide down the magazines due to the force of gravity. The storage station at the bottom of the stack includes means to pivot the stack around its lower end and thus increase the angle the stack makes with respect to a horizontal plane.

In operation, the assembler pivots the stack by means of an attached handle, thus increasing the angle of the stack to a point where the force of gravity causes the components to slide down there respective magazines and result in one component being discharged from each magazine. The operator then restores the stack to its normal position so that no additional components will be discharged from any of the magazines. The operator is thus provided with a matrix shaped configuration of discharged components, each position in the matrix providing a component corresponding to a position on the circuit board into which a component is to be inserted. As the operator removes a discharged component from one of the stack's magazines, a new component is not discharged from that magazine and hence the operator is aware of which positions on the circuit board remain to be populated with components.

Accordingly, it is a general object of the present invention to provide a new and useful semiautomatic assembly apparatus.

Another object of the present invention is to provide a new and useful assembly apparatus for aiding an assembler with the installation of electronic components on a circuit board.

Still another object of the present invention is to provide a new and useful assembly apparatus which is designed for specialized handling of electronic component parts of the type which are shipped in magazine-like containers.

A further object of the present invention is to provide a new and useful assembly apparatus which delivers a set of component parts to the assembler, wherein a component part is provided for each position on a circuit board which is to receive a component.

A still further object of the present invention is to provide a new and useful assembly apparatus which delivers a set of component parts required to populate one circuit board and indicates to the assembler where each part provided is to be installed.

An additional object of the present invention is to provide a new and useful assembly apparatus which is designed to handle dual-in-line integrated circuit packages and/or sockets.

An additional object of the present invention is to provide a new and useful assembly apparatus which may be easily changed to handle various circuit boards and various parts arrangements.

A still additional object of the present invention is to provide a new and useful assembly apparatus which is reliable, low in cost, and requires minimum setup time.

These and other objects, features and advantages of the present invention, as well as the invention itself, may be more fully understood from the following description of the preferred embodiment when read in conjunction with the accompanying drawings.

BRIEF DESCRIPTION OF THE DRAWINGS

FIG. 1 is a perspective view illustrating the assembly apparatus of the present invention.

FIG. 2 is a partial side view illustrating components dispensed from one of the dispensing magazines of the first parts magazine storage station.

DESCRIPTION OF THE PREFERRED EMBODIMENT

Referring now particularly to the drawing, FIG. 1 illustrates an assembly apparatus, indicated generally by the reference numeral 10, according to the preferred embodiment of the present invention. The apparatus of the preferred embodiment comprises the following elements: a first parts magazine storage station 12, a second parts magazine storage station 14, a support frame 16, a pivoting mechanism 18, and a handle 20. It should be understood that the geometric relationship of these elements with respect to each other as shown in FIG. 1 is merely suggestive and it is contemplated that the physical layout of these elements may be changed to suit a particular installation.

The dispensing magazines 32–38 and 56–64 used in the present invention are of the type utilized by manufacturers to prevent component damage during shipping. Typically, the components are prevented from coming out the ends of the magazines 32–38 and 56–64 by pins (not shown) or similar means which partially or fully block the ends of the dispenser magazines 32-38 and 56-64. When it is desired to remove a component from a magazine, one of the pins is removed, thus allowing components to be dispensed from that end as the magazine is tilted. In the preferred embodiment of the present invention, the apparatus 10 is utilized to dispense DIP-type integrated circuit packages (ICs) 30 which are to be installed in matching sockets 52,54 connected to a printed circuit board 50. However, those skilled in the art will realize that the present invention may be utilized to dispense other types of components which are packaged in similar types of dispenser magazines. In addition, those skilled in the art will realize that the dispensed components may be mounted directly on the printed circuit board 50 instead of being installed in sockets 52,54 which are mounted on the printed circuit board 50.

The first parts magazine storage station 12 includes a rigid platform 40. Dispenser magazines 32-38, loaded with ICs 30, are demountably engaged on the platform 40 by pressing them into the corresponding slots in members 42,42'. The retaining pins are removed from the lower end of each magazine 32-38 to permit the ICs 30 to be dispensed. A guide block 44 is connected to the platform 40 at the lower end of each dispenser magazine position so that as an IC 30 is dispensed from its dispenser magazine, it slides along the dispenser magazines respective guideblock 44 until it is blocked from further movement by retaining member 46.

The first parts magazine storage station 12 is normally supported at the acute angle shown by means of frame support 16 and pivoting mechanism 18. The angle that the first parts magazine storage station 12 makes with respect to the horizontal plane supporting the apparatus 10 may be increased by pulling up on attached handle 20, thus pivoting the station 12 around stationary pivoting mechanism 18 (FIG. 2).

Again referring to FIG. 1, the second parts magazine storage station 14 is similar in construction to the first station 12. The second station is stacked on top of the first station and held with its platform 48 in parallel alignment with the first station's platform 40 by means of four support blocks 50. Thus, as the first station 12 is pivoted, the second station follows the angle assumed by the first station 12. Note that the lower end of the second station 14 is offset from the lower end of the first station 12 so that platform 48 does not block an assembler from accessing ICs 30 dispensed from the first station 14.

Although not shown in FIG. 1, those skilled in the art will realize that additional parts magazines storage stations may be similarly stacked on top of the second station 14 or that the second station 14 may be eliminated.

Still referring to FIG. 1, the operation of the apparatus 10 as a means for dispensing ICs 30 and indicating installation locations will now be explained. For purposes of illustration, the printed circuit board 50 to be populated with ICs 30 will be assumed to include two rows of IC sockets 52,54, the first row including four sockets 52-1, 2, 3, 6 and the second row including five sockets 54-1, 2, 4, 5, and 6. However, it should be noted that each row of the printed circuit board 50 shown could include up to six sockets. Each of the stations members 42,42' is capable of accommodating up to six dispenser magazines, thus providing a one-to-one correspondence with the maximum number of sockets that can be installed on each printed circuit board 50 row. Each station 12, 14 may be considered as having six columns positions in each row, the six columns positions corresponding to the maximum number of dispenser magazines which each station 12,14 can accommodate and further corresponding to the maximum of six sockets which can be installed on each printed circuit board 50 row.

As shown, since the first, second, third and sixth columns of the first row of the printed circuit board 50 have IC sockets 52-1, 2, 3 and 6 installed respectively, dispenser magazines 32, 34, 36 and 38 are mounted in corresponding positions on the first station 12. Similarly, since the first, second and fourth through sixth columns of the second row of the printed circuit board 50 have IC sockets 54-1, 2, 4, 5 and 6 installed, dispenser magazines 56, 58, 60, 62 and 64 are installed in the corresponding column positions of station 14. There is thus provided a 2×6 matrix of dispenser magazine positions corresponding to the 2×6 matrix of IC socket positions, with dispenser magazines installed in those matrix positions corresponding to IC sockets installed on the PC board 50, each dispenser magazine being loaded with ICs 30 of the type to be installed in the corresponding socket position.

With the dispenser magazines thus mounted, the assembler pulls up on handle 20, thus pivoting the stations 12,14 to an angle at which one IC 30 will slide out of the lower end of each dispenser magazine due to the force of gravity. As the ICs 30 are discharged from the dispenser magazines, they straddle and are guided down the surface of the corresponding guide blocks 44 until they come in contact with retaining members 46 (FIG. 2). The assembler next restores the stations to their normal position by lowering handle 20.

At this time, a set of ICs 30 has been dispensed in the pattern and quantity corresponding to the unpopulated IC sockets 52, 54 on the PC board 50. In the preferred embodiment, the assembler may now remove ICs 30 from the storage stations 12, 14 and insert them in the corresponding sockets 52, 54 on the printed circuit board 50. As an IC 30 is removed from a storage station 12,14, another IC 30 is not discharged from the corresponding dispenser magazine, since the angle of the storage stations 12,14 is less than that at which ICs 30 will slide down the dispenser magazines due to the force of gravity. Thus the assembler can tell which sockets 52,54 on the PC board 50 remain to be populated and from which dispenser magazine the required ICs 30 should be removed.

In the illustration shown in FIG. 1, the assembler has already removed ICs 30 from magazines 56-64 and 32-34, and installed them in sockets 54-1, 2, 4, 5, 6 and 52-1,2, respectively. Since a dispensed IC 30 is still available at the lower end of dispenser magazine 36, which is in the first row, third column position of the matrix pattern, the assembler knows that this IC 30 is to be installed in socket 52-3. Similarly, the assembler also knows that the IC 30 dispensed from magazine 38 is to be installed in socket 52-6.

After the assembler completes populating a PC board 50 with ICs 30, he again pulls up on handle 20, thus dispensing another set of ICs 30 which will be used to populate another PC board 50.

Those skilled in the art will realize that the present invention may be utilized in other ways. Thus, even if a socket were present in the row 1-column 4 position of the printed circuit board 50, the assembler would know that he is not to insert an IC 30 there since no dispenser magazine is in the corresponding position of the first storage station. Alternately, if the second row of the PC board 50 included eight sockets and the first row included two sockets, the second station could be loaded with six dispenser magazines containing ICs 30 to populate the six left-most corresponding positions in the second row of the PC board 50 and the two left-most dispenser magazines in the first station could dispense ICs 30 for the two right-hand sockets on the second row of the PC board 50. The ICs 30 required to populate the two sockets in the first row of the PC board 50 could be dispensed from two of the remaining four magazine positions of the first station 12. The apparatus 10 may thus be adapted to meet the requirements of the many situations which may be encountered in printed circuit board manufacturing.

Having shown and described the preferred embodiment of the present invention, those skilled in the art will realize that various omissions, substitutions and additions may be made without departing from the spirit of the invention. It is the intention, therefore, to be limited only by the scope of the following claims.

What is claimed is:

1. An apparatus for dispensing components and indicating installation locations of the dispensed components on a workpiece, said workpiece including at least one row of said locations to receive said components and at least one column of said locations to receive said components, said apparatus comprising:
   a plurality of storage means, each of said plurality of storage means for dispensing said components for installation in one of said rows of said locations, each of said storage means including
   a platform, and
   a plurality of dispensing means, coupled to the surface of said platform, each of said plurality of dispensing means for dispensing said components for installation in one column in the row of its respective storage means;
   means for supporting said plurality of storage means at an acute angle with respect to a horizontal plane; and
   means, connected to said plurality of storage means, said means for increasing the angle said plurality of storage means makes with respect to said horizontal plane.

2. The apparatus in accordance with claim 1 wherein each of said plurality of storage means further includes means, connected to said platform, said means for preventing said components from falling off the lower end of said platform.

3. The apparatus in accordance with claim 2 wherein each of said dispensing means is characterized as a tubular magazine-like container.

4. The apparatus in accordance with claim 3 wherein said plurality of storage means are stacked one on top of another and offset from each other so as to allow access to said dispensed components.

5. The apparatus in accordance with claim 4 wherein said plurality of storage means further includes means, connected to the lowest of said plurality of storage means, said means for pivoting said plurality of storage means as the angle said plurality of storage means makes with respect to said horizontal plane is increased.

6. The apparatus in accordance with claim 5 wherein said means for increasing the angle said plurality of platforms makes with respect to said horizontal plane includes a handle.

7. The apparatus in accordance with claim 4 wherein each of said dispensing means includes a component dispensing magazine.

8. An apparatus for dispensing components and indicating installation locations of the dispensed components on a workpiece, said apparatus comprising:
   a platform;
   a plurality of component dispensing magazines, coupled to the surface of said platform, said component dispensing magazines for feeding said components;
   means for supporting said platform at a first angle with respect to a horizontal plane, said first angle characterized as being less than that required to produce feeding of said components through said component dispensing magazines due to the force of gravity; and
   means for rotating said platform from said first angle to a second angle, said second angle characterized as being one that will produce feeding of said components through said component dispensing magazines due to the force of gravity, said rotating means further for restoring said platform to said first angle.

9. The apparatus in accordance with claim 8 wherein said rotating means includes pivot means, connected to the lower end of said platform, said pivot means for pivoting the lower end of said platform as said platform is rotated between said first and said second angles.

10. The apparatus in accordance with claim 9 wherein said rotating means further includes a handle connected to said platform.

11. The apparatus in accordance with claim 8 wherein said means for supporting said platform at said first angle includes a frame, the lower surface of said platform resting on and supported by said frame when said platform is positioned at said first angle.

12. The apparatus in accordance with claim 9 or 11 wherein said component dispensing magazines are mounted with their longitudinal axis in parallel alignment with the surface of said platform, whereby said dispensing magazines follow the angle said platform makes with respect to said horizontal plane.

13. The apparatus in accordance with claim 12 wherein the lower ends of said dispensing magazines are positioned at a distance from the lower end of said platform, said distance approximately equal to the length of said components.

14. The apparatus in accordance with claim 13 wherein said platform further includes means for retaining said components on the surface of said platform as said components are discharged from said dispensing magazines.

* * * * *